United States Patent [19]

Yoneda et al.

[11] Patent Number: 4,929,891
[45] Date of Patent: May 29, 1990

[54] EXCITING UNIT FOR INTERNAL MAGNET TYPE METERS

[75] Inventors: Akira Yoneda; Katsuyoshi Miura, both of Tokyo, Japan

[73] Assignee: Yokogawa Electric Corporation, Tokyo, Japan

[21] Appl. No.: 298,218

[22] Filed: Jan. 13, 1989

Related U.S. Application Data

[63] Continuation of Ser. No. 74,366, Jul. 16, 1987, abandoned.

[30] Foreign Application Priority Data

Aug. 7, 1986 [JP] Japan ................................ 61-185528

[51] Int. Cl.⁵ ............................................. G01R 1/16
[52] U.S. Cl. ........................ 324/154 PB; 324/151 A
[58] Field of Search ......... 324/151 A, 151 R, 154 PB

[56] References Cited

U.S. PATENT DOCUMENTS

| | | | |
|---|---|---|---|
| 1,920,764 | 8/1933 | Nickle | 324/151 A |
| 2,110,680 | 3/1938 | Rowell | 324/151 A |
| 2,834,942 | 5/1958 | Eggers | 324/151 A |
| 3,026,478 | 3/1962 | Mott et al. | 324/151 A |
| 3,891,923 | 6/1975 | Sakaguchi | 324/154 R |

Primary Examiner—Reinhard J. Eisenzopf
Assistant Examiner—Maura K. Regan
Attorney, Agent, or Firm—Moonray Kojima

[57] ABSTRACT

An exciting unit used in an internal magnet type meter, wherein a spacer, having a thickness corresponding to the length of a gap, is attached to the circumference of a permanent magnet and a screw is fitted in a yoke so that the permanent magnet may be mounted in the yoke by forcing the permanent magnet onto the inner face of the yoke through the spacer by means of the screw.

2 Claims, 3 Drawing Sheets

EXCITING UNIT FOR INTERNAL MAGNET TYPE METERS

This application is a continuation of Ser. No. 07/074366, filed 7/16/87, now abandoned.

BACKGROUND OF THE INVENTION

1. Field of Invention.

This invention relates to an exciting unit used in an internal magnet type meter, and more particularly, to such a unit wherein a cylindrical permanent magnet is mounted in a cylindrical yoke through a gap wherein the effective sides of the moving coil can turn.

One moving coil type meter is the internal magnet type meter. This type meter has an exciting unit wherein a permanent magnet is arranged in a cylindrical yoke forming a magnetic circuit. The internal magnet type meter can be made to have a smaller size and is less influenced by external magnetic fields than the external magnet type meter. The moving coil in the internal magnet type meter is so arranged that its effective sides can move in a gap formed of its permanent magnet and yoke, to enclose the magnet. A magnetic flux to be generated by the magnet interlinks with the effective sides of the moving coil in that gap.

If a current to be supplied to the moving coil is denoted as I and if the density of the magnetic flux caused to interlink with the effective sides of the moving coil in the gap is denoted as B, the angle $\theta$ of the coil of the moving coil type meter is expressed by the following equation (1), as is well known in the art, whether the magnet is of the internal type or external type:

$$\theta = K \cdot I \cdot B \tag{1}$$

wherein K is a constant determined by the number of turns, shape, etc, of the moving coil.

Thus, the angle of deflection $\theta$ of the moving coil type meter is proportional to the product of the current I supplied to the moving coil and the density of the magnetic flux B acting upon the effective sides of that coil.

A number of moving coil type meters are used for measuring quantities of electricity in various fields handling electricity and electrons. This makes it desirable to lower the cost and decrease the size in order to expand the commercial market therefor. In order to attain such goals, the number of parts used in such meters must be reduced and the number of machining steps must also be reduced.

If the magnetic flux density B in the gap is maintained constant within the range of the deflection angle $\theta$ of the moving coil, the deflection angle $\theta$ is proportional exclusively to the current I, as seen from equation (1), so that the scale distribution of the scale plate becomes even.

In order to clarify the improvement produced by the invention, the structure of the exciting unit of the internal magnet type meter currently in use will be first described.

2. Description of Prior Art

FIG. 1 depicts an exemplary internal magnet type meter used in the prior art and comprising a cylindrical yoke 1, a holding frame 2 and a cylindrical permanent magnet 3 attached to holding frame 2. A moving coil 4 is arranged to enclose permanent magnet 3 and is sandwiched between upper and lower tension springs 5a, 5b through tension bands (not shown). Permanent magnet 3 carrying moving coil 4 is arranged in cylinder of yoke 1 to form between the outer circumference of yoke 1 a gap in which moving coil 4 is allowed to turn. This gap should have a length smaller in deviation than a predetermined value within the range of the angle of deflection $\theta$ of moving coil 4. For this, it is necessary that the cylindrical internal magnet 3 be positioned coaxially with cylindrical yoke 1. Holding frame 2 is formed with an arm 2a for attaching it to yoke 1. Arm 2a has its back formed with a stepped portion P by a turnery. This stepped portion P is fitted in the inner face Q of cylindrical yoke 1 so that yoke 1 and permanent magnet 3 may be concentric. The lower part of FIG. 1 shows the yoke 1 with inner face Q, which is shown disassembled from the upper part. When assembled, yoke 1 will fit about frame 2, magnet 3, coil 4, with stepped part P holding inner face Q, and the screws 6a, 6b fitting in the screw holes.

On the other hand, internal magnet 3 is made immovable in the upward and downward directions and in the turning direction with respect to yoke 1 by means of the two screws 6a and 6b.

The internal magnet type meter thus constructed is featured by it small size and by its strength against external magnetic fields. However, this prior art meter has certain disadvantages, such as (1) in order that internal magnet 3 may be arranged concentrically with yoke 1, holding frame 2 is turned with reference to the outer circumference of magnet 2; and (2) in order that internal magnet 3 be held in fixed positions in the vertical and turning directions, two screws 6a, 6b have to be used, and their thread holes must be formed in the yoke 1. Thus, the prior art exciting units must use a large number of parts and require for their construction a large number of machining steps. Accordingly, it is difficult to reduce cost and size of prior art meters.

SUMMARY OF THE INVENTION

Accordingly, an object of the invention is to overcome the foregoing and other deficiencies and disadvantages of the prior art.

Another object is to provide an internal magnet type meter which contains a reduced number of parts and requires fewer machining steps to manufacture.

A further object is to provide an internal magnet type meter which has a gap length with only slight deviation from a predetermined value to have a substantially constant density of magnetic flux B within the range of deflection angle of a moving coil so that a scale plate has a substantially even scale distribution.

A still further object is to provide an internal magnet type meter which is produced in a smaller size and at a lower cost than the prior art.

In a preferred embodiment of the invention, a spacer having a thickness corresponding to the gap length is attached to the circumference of a permanent magnet, and a yoke is fastened by means of a screw, by which the permanent magnet is forced onto the inner circumference of the yoke through that spacer so that it is attached to the yoke.

DETAILED DESCRIPTION OF THE PREFERRED EMBODIMENTS

Figure 2A:
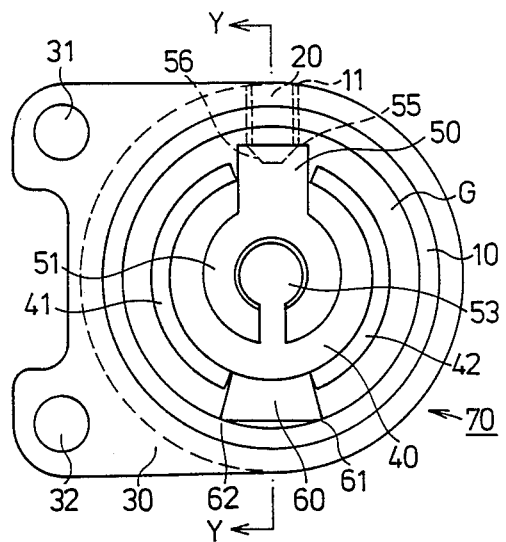
FIG. 2(A) is a top plan view depicting an illustrative embodiment of the invention.
Figure 2B:
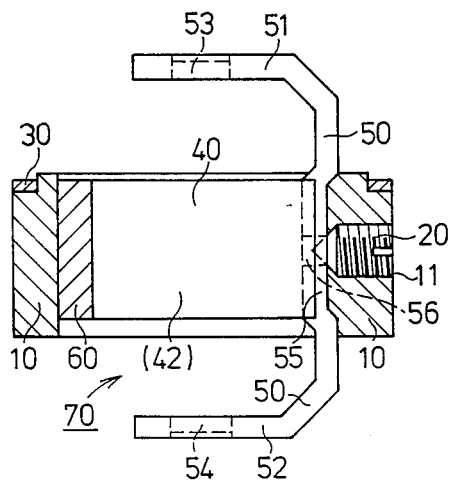
FIG. 2(B) is a partial section taken in a longitudinal direction along line Y—Y of FIG. 2(A).

Turning now to FIGS. 2(A),2(B), the invention comprises yoke 10, which is prepared by cutting a drawn pipe into a desired length so that even ones can be mass-produced. Yoke 10 is formed at its side with a threaded hole 11, in which is driven a screw 20 having such a length as to have its tip projecting into the inside of yoke 10. A flange 30 is press-fitted on one end of yoke 10. Flange 30 is formed with mounting holes 31 and 32 for mounting the exciting unit on the base of the meter.

A cylindrical permanent magnet 40 is arranged when used in yoke 10. In this case, permanent magnet 40 has an external diameter which is smaller than the internal diameter of yoke 10 so that a gap G, having a constant length L, is formed between the inner circumference of yoke 10 and the outer circumference of magnet 40. To the side portions of permanent magnet 40, there are attached a pair of semicircular pole shoes 41, 42 which are spaced apart from each other. A holding frame 50 is made of a non-magnetic material. A spacer 60 is also made of a non-magnetic material. Holding frame 50 is constructed by folding two end portions of a long flat plate at a right angle in a common direction to form arms 51,52 which are formed with holes 53,54 for mounting later described bushes.

Holding frame 50 has its stem 55 attached to permanent magnet 40 between the pole shoes 41,42 and formed with a hole or recess 56 in which is received the tip of screw 20 fitted in yoke 10. Spacer 60 is formed into a trapezoidal shape which has such a thickness as to form gap G having predetermined length L. Spacer 60 has its shorter side attached to the circumference of permanent magnet 40 between pole shoes 41 and 42 at the side opposed to holding frame 50. The longer side of spacer 60 has its two corners 61, 62 chamferred to fit the inner circumference of yoke 10. Pole shoes 41,42, holding frame 50 and spacer 60 are attached, while maintaining the above specified positional relations, to permanent magnet 40 by means of an adhesive or a solder.

Permanent magnet 40, thus held by holding frame 50, is mounted in yoke 10 to construct an exciting unit 70 of the internal magnet type meter. For this purpose, the tip of screw 20 fitted in yoke 10 is inserted into hole 56 formed in holding frame 50, and screw 20 is then driven by means of a driver until the chamferred corners 61,62 of spacer 60 comes into contact with the inner face of yoke 10. As a result, permanent magnet 40 is held in position in yoke 10. In this position, permanent magnet 40 is coaxial with yoke 10.

Figure 3A:
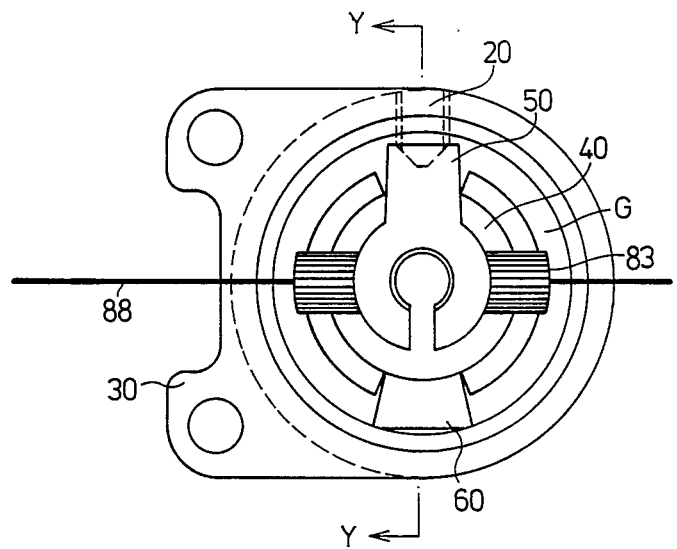
FIG. 3(A) is a top plan view depicting another illustrative embodiment of the invention wherein a moving part is mounted in the exciting unit of the embodiment of FIGS. 2(A),2(B).
Figure 3B:
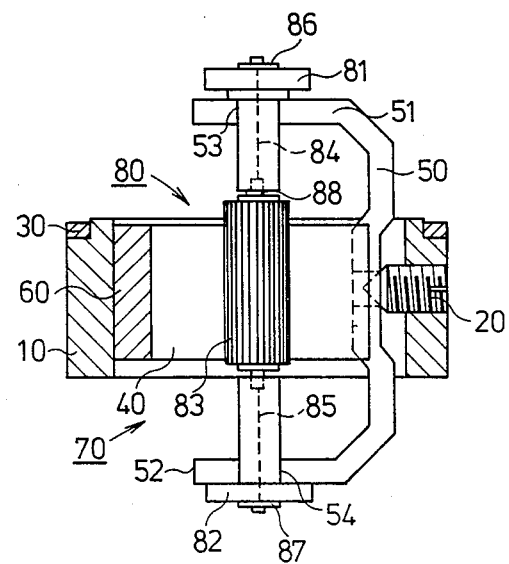
FIG. 3(B) is a partial section taken in a longitudinal direction along line Y—Y of FIG. 3(A).

FIGS. 3(A) and 3(B) show the structure of the internal magnet type meter wherein a moving part 80 is mounted in exciting unit 70. This exciting unit is otherwise substantially the same as that of FIGS. 2(A) and 2(B). Similar parts of the two embodiments are labelled with similar numbers and discussion thereof is omitted hereat for sake of clarity of description. In FIGS. 3(A) and 3(B), cylindrical bushes 81,82 are made of an insulating material and have a T-shaped section. Bushes 81,82 are movably fitted in holes 53,54 which are formed in two arms 51,52 of holding frame 50. A moving coil 83 is arranged to enclose permanent magnet 40. Tension bands 84,85 and tension springs 86,87 are added to bushes 81,82, respectively, as depicted. Bush 81 and tension spring 86 shown in FIG. 3(B) are omitted in FIG. 3(A).

Moving coil 80 is extended under tension between tension springs 86,87 by tension bands 84,85. A pointer 88 is attached to moving coil 83. When moving coil 83 is mounted, permanent magnet 40, held by holding frame 50, is then forced onto the inner face of yoke 10 through spacer 60 by action of screw 20 so that it is mounted in yoke 10. In this case, the effective sides of moving coil 80 are arranged in gap G, which is defined by yoke 10 and permanent magnet 40.

As expressed by equation (1), moving coil 83 is turned by angle $\theta$ in accordance with the product of current I flowing therethrough and magnetic flux density B of gap G. The value of current I can be measured by reading out the value of angle $\theta$ from the indication of the scale plate (not shown) from pointer 88.

Although FIGS. 3(A) and 3(B) exemplify a tension band type meter, the invention can also be applied to a pivot type meter, wherein moving coil 83 is held so that the pivot carried thereby is caused to engage with the bearing screws attached to arms 51,52 of holding frame 50. In this case, the control torque of moving coil 83 is given by a control spring.

In the embodiment, spacer 60 has its longer side chamferred at its two corners to fit the inner circumference of yoke 10. These chamferred corners 61,62 are in contact with the inner face of yoke 10. If the longer side of spacer 60 were not chamferred but wholly formed into such an arcuate shape as to contact with the inner circumference of yoke 10, it would contact in its entirety with the inner face of yoke 10. If, in this modification, dust, or the like, is present on either the inner face of yoke 10 or spacer 60, it will probably change the size of gap G. On the contrary, in the invention, in which only the chamferred portions 61,62 are kept in contact with the inner face of yoke 10, the dust will hardly change the size of the gap G, even if its is on the inner face of yoke 10. The shape of spacer 60 need not always be trapezoidal, but may be, for example, rectangular. In this modification, the two corners are also chamferred.

Advantageously, in the invention, permanent magnet 40 is mounted in yoke 10 by forcing it through spacer 60 to the inner face of yoke 10 so that it can be concentric with yoke 10 without any machining work, such as the turning work of the prior art. As a result, simpler means than that used to produce the prior art meters can be used to provide the invention comprising an internal magnet type meter which has a gap length less deviated from the predetermined value, a magnetic flux density B held constant in the gap within the range of the deflection angle of the moving coil, and an even scale distribution of the scale plate.

Figure 1:
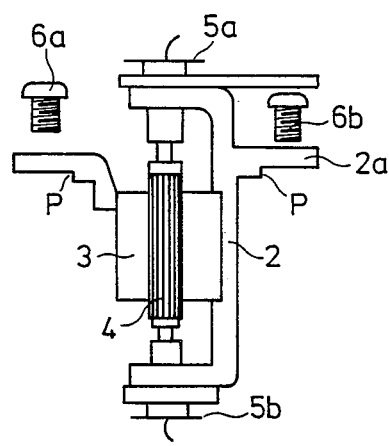
FIG. 1 is a diagram depicting a prior art internal magnet type meter.
Figure 1:
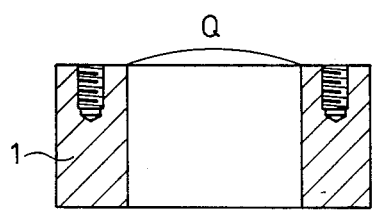

Advantageously, by means of screw 20 for holding the concentricity, moreover, permanent magnet 40 can be positioned axially and angularly at the same time with respect to yoke 10. In the meter of the prior art, such as shown in FIG. 1, disadvantageously, the positioning operations of the permanent magnet 40 axially and angularly with respect to the yoke 10 were accomplished by means of two screws 6a,6b. On the other hand, in the invention, those positioning operations are accomplished by making use of screw 20, so that the meter can be produced with fewer number of parts and at a lower cost. This greatly increases the commercial value of such meters.

Also, in the invention, permanent magnet 40 can be easily removed, if necessary, from yoke 10 so that the meter can be readily serviced.

Thus, to recapitulate, according to the invention, an exciting unit is provided for use in internal magnet type meters, wherein fewer component parts are used, and produced with fewer machining steps and having simpler and smaller structure produced at lower cost, while ensuring that the eccentricity of the internal magnet is of the same order as that of prior art meters, such as shown in FIG. 1.

What is claimed is:

1. In an exciting unit for use with an internal magnet type meter, comprising a cylindrical permanent magnet of a first axial dimension, said permanent magnet having pole shoes of a dimension substantially equal to said first axial dimension, and a cylindrical yoke incorporating said permanent magnet through an air gap arranged to make rotatable effective sides of a movable coil, the improvement comprising a generally rectangular column-like spacer formed of a non-magnetic material and having a radial thickness corresponding to said air gap of an dimensional substantially equal to said first axial dimension, one side of said spacer being secured to a peripheral surface of said permanent magnet, and an opposite site of said spacer being formed with two chamferred angular portions;

a holding frame formed of a long, flat and tubular non-magnetic material, both ends of which are shaped by folding to be crooked at right angles in the same direction, said frame comprising an arm member to which said movable coil is attached and a stem formed with a hole or recess, said stem being fitted to said peripheral surface of said permanent magnet on the opposite side of said spacer, said holding frame being disposed inwardly of said cylindrical yoke;

a flange secured to said yoke and formed with a mounting hole for mounting said exciting unit on a base;

a single screw hole formed in said cylindrical yoke; and a single mounting screw fitted into said single screw hole of said cylindrical yoke and having a tip thereof engaging said hole or recess of said stem of said holding frame so as to mount in said cylindrical yoke said permanent magnet secured to said holding frame through said spacer;

wherein by rotating said single mounting screw only said chamferred portions of said spacer are thrust against an inner surface of said cylindrical yoke so that said cylindrical permanent magnet is mounted in said cylindrical yoke and accurately positioned in the axial and peripheral directions and locked in position by use of only said single mounting screw engaged in said hole or recess of said stem of said holding frame and without requiring the circular shape of said cylindrical permanent magnet to be altered, or the cylindrical yoke to have any other positioning hole.

2. The unit of claim 1, wherein said spacer is formed into a trapezoidal shape having its side chamferred at its two corners to abut against the inner face of said yoke.

* * * * *